United States Patent [19]

Keating

[11] Patent Number: 5,751,169

[45] Date of Patent: May 12, 1998

[54] EMITTER COUPLED LOGIC (ECL) GATE WHICH GENERATES INTERMEDIATE SIGNALS OF FOUR DIFFERENT VOLTAGES

[75] Inventor: Pierce V. Keating, Pompano Beach, Fla.

[73] Assignee: Motorola, Inc., Schaumburg, Ill.

[21] Appl. No.: 641,865

[22] Filed: May 2, 1996

[51] Int. Cl.[6] ............................................. H03K 19/086
[52] U.S. Cl. ................................. 326/126; 326/80
[58] Field of Search ........................... 326/80, 126, 127

[56] References Cited

U.S. PATENT DOCUMENTS

| | | | |
|---|---|---|---|
| 3,628,000 | 12/1971 | Weiss | 326/52 |
| 3,681,614 | 8/1972 | Kroos | 326/126 |
| 4,408,134 | 10/1983 | Allen | 326/126 |
| 4,551,639 | 11/1985 | Takeda et al. | 326/126 |
| 4,866,303 | 9/1989 | Kanai et al. | 326/126 |
| 5,079,452 | 1/1992 | Lain et al. | 327/223 |
| 5,220,212 | 6/1993 | Sinh | 326/126 |
| 5,250,860 | 10/1993 | Chu et al. | 326/126 |
| 5,289,055 | 2/1994 | Razavi | 326/126 |

FOREIGN PATENT DOCUMENTS

| | | | |
|---|---|---|---|
| 0 586 128 A1 | 3/1994 | European Pat. Off. | 326/127 |
| 58-172021 | 10/1983 | Japan | 326/127 |
| 2-195721 | 8/1990 | Japan | 326/126 |
| 3-85818 | 4/1991 | Japan | 326/126 |
| 3-195124 | 8/1991 | Japan | 326/126 |

OTHER PUBLICATIONS

Razavi, B., Ota, Y., Shwartz, R.G., "Design Techniques for Low–Voltage High–Speed Digital Bipolar Circuits," IEEE, Journal of Solid–State Circuits, vol. 29, No. 3, Mar. 1994; pp. 332–339.

*Primary Examiner*—Edward Westin
*Assistant Examiner*—Benjamin D. Driscoll
*Attorney, Agent, or Firm*—Barbara R. Doutre

[57] ABSTRACT

A fully differential, low voltage ECL gate (300) receives differential input signals (A, Ax, B, Bx) and provides them to first and second differential amplifiers (306, 328). The first differential amplifier (306) amplifies and level shifts the differential input (A, Ax) to provide a differential output (OUTx). The second differential amplifier amplifies the second differential input (B, Bx) to provide an amplified output, OUT. The amplified output signal, OUT, provides a different voltage level than that provided by amplified level shifted output signal, OUTx. The amplified level shifted output (OUTx) of the first differential amplifier (306) is then compared to the amplified output (OUT) of the second differential amplifier (328) to provide either an AND gate or an OR gate function.

13 Claims, 3 Drawing Sheets

EMITTER COUPLED LOGIC (ECL) GATE WHICH GENERATES INTERMEDIATE SIGNALS OF FOUR DIFFERENT VOLTAGES

TECHNICAL FIELD

This invention relates in general to digital bipolar logic circuits, and more particularly emitter coupled logic circuits.

BACKGROUND

In integrated circuit designs using low supply voltages, a designer is severely constrained with regard to stacking devices within a circuit. For emitter coupled logic (ECL) circuits, the transistor stacking constraint often rules out many traditional current steering topologies. Some existing non-stacked ECL structures make use of single ended inputs, however single ended input topologies compromise the noise immunity provided for in conventional higher supply voltage ECL structures.

Referring to FIG. 1, there is shown a prior art ECL circuit 100 which utilizes two sets of stacked differential amplifiers 102, 104. A disadvantage associated with ECL circuit 100 is that the voltage drop from the collector to emitter (VCE) associated with each transistor pair is added to the required voltage across the load and bias elements. The use of stacked transistors 102, 104 thus requires a higher supply voltage, Vcc. Furthermore, a level shifting operation must be performed on input signals B and Bx which requires the use of an additional buffer/level shifting stage 106. The additional buffer stage 106 increases the integrated surface area and cost of performing a logic function.

FIG. 2 is a prior art ECL circuit 200 which avoids the use of stacked transistors. A drawback of the ECL circuit 200 is that it utilizes supply referenced single ended input signals A and B, which generally results in inferior noise immunity. Another drawback associated with circuit 200 is that it requires the use of a voltage reference, Vref, 202 to establish a switching point for the input signals A and B. Additional current and surface area are required to implement the voltage reference 202.

Accordingly, there is need for an ECL circuit which is capable of performing a logic function, such as a logical AND or OR, at low supply voltages with minimal stacked transistors and improved noise immunity.

DETAILED DESCRIPTION OF THE PREFERRED EMBODIMENT

Figure 1:
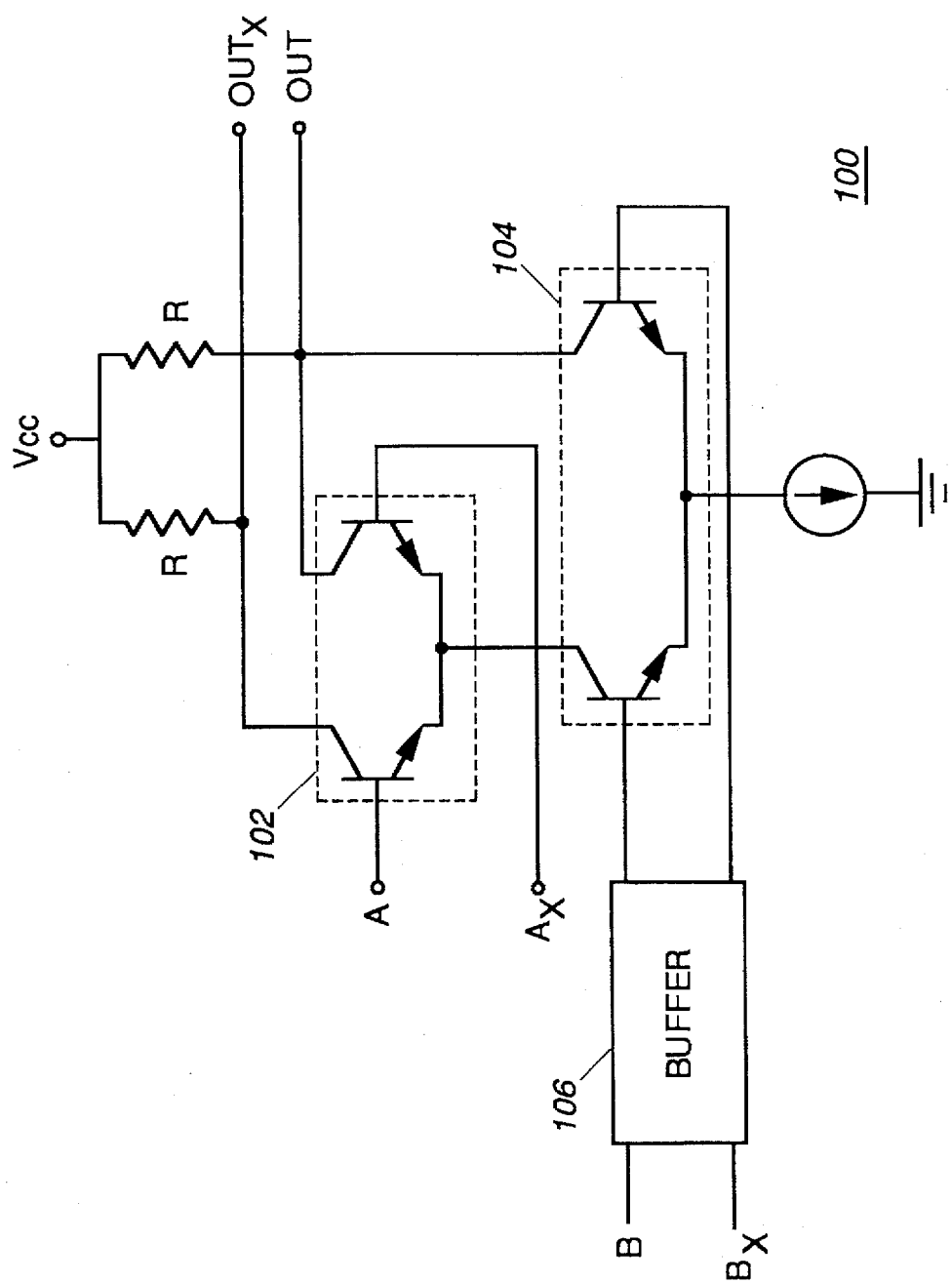
FIG. 1 is a prior emitter coupled logic circuit.
Figure 2:
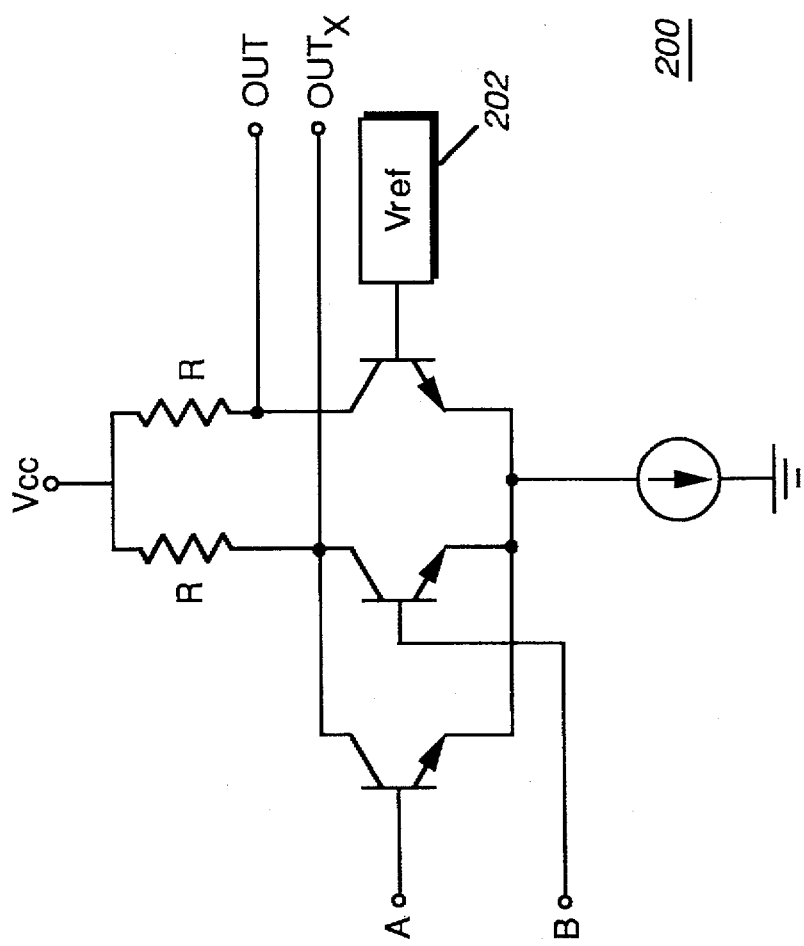
FIG. 2 is a prior art emitter coupled logic circuit.
Figure 3:
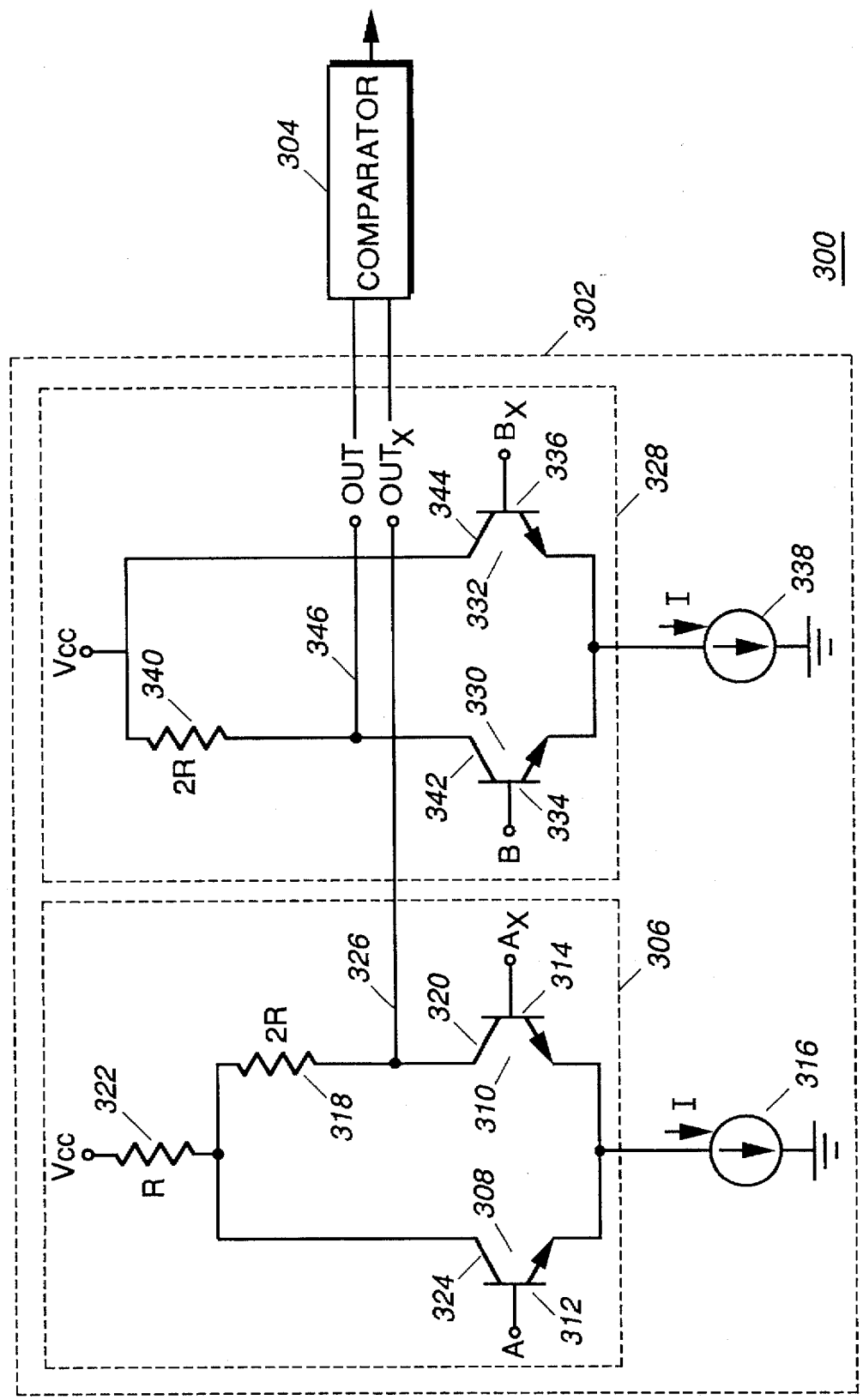
FIG. 3 is an emitter coupled logic circuit in accordance with the present invention.

Referring now to FIG. 3, there is shown an ECL gate 300 which provides either an AND gate or an OR gate in accordance with the present invention. ECL gate 300 includes an exclusionary circuit 302 which, in accordance with the present invention, receives complementary input signals A, Ax, B, and Bx and generates exclusionary output signals, OUT and OUTx. The exclusionary output signals, OUT, OUTx are applied to a comparator 304 to complete the logic gate 300. The exclusionary circuit 302 of the present invention operates under low voltage conditions, such as 1.4 volts, and allows for complementary input signals A, Ax, B, and Bx having a small voltage differential, such as 100 millivolts, to be translated into output signals characterized by an exclusionary function. For the purposes of this application, an exclusionary function is defined as a function which can take all combinations of complementary binary input signals (differential inputs) and convert them to differential output signals OUTx, OUT which, when compared to each other, result in equivalent logic signals for all input combinations except one. In accordance with the present invention, the output signals OUT, OUTx of exclusionary circuit 302 provide differential outputs which meet or exceed the minimum required voltage differential to switch the inputs of further ECL circuits.

The exclusionary circuit 302 of the present invention generates output voltage signals (OUT and OUTx), one of which is larger than the other under all complementary input signal combinations of A, Ax, B, Bx but one. These exclusionary output signals OUT, OUTx are applied as inputs to the comparator 304 to provide either an AND gate or an OR gate.

In accordance with the preferred embodiment of the invention, exclusionary circuit 302 includes a first differential amplifier 306 formed of first and second emitter coupled transistors 308, 310 receiving complementary input signals A, Ax through their respective bases 312, 314. The voltages of complementary input signals A, Ax control the conduction states of transistors 308, 310 respectively. First differential amplifier 306 will also be referred to as first differential pair 306. A first current sink 316 is coupled to the emitters of transistors 308, 310 for sinking the current, I, through the conductive path.

A first resistive load 318 is coupled to a collector 320 of the second transistor 310 to provide an amplification factor (2R) for the first differential amplifier 306. A level shifting resistor (R) 322 is coupled to a supply source, Vcc, and to the first resistive load 318 as well as to a collector 324 of the first transistor 308. The level shifting resistor 322 provides a level shifting factor which is at least the minimum voltage required to switch an ECL gate when compared to supply. Resistor 322 also provides a current path for whichever transistor 308 or 310 is turned on. A first output port 326 is taken from the collector 320 of the second transistor 310 to generate the output signal, OUTx. Output signal OUTx provides an amplified level shifted output to the comparator 304.

A second differential amplifier 328, also referred to as a second differential pair, formed of third and fourth emitter coupled transistors 330, 332 receives the complementary input signals B, Bx through their respective bases 334, 336. The complementary input signals B, Bx control the conduction states of transistors 330, 332 respectively. Complementary signals B, Bx are substantially equivalent in magnitude to signals A, Ax to provide for four combinations of differential input voltages into the bases of the first and second differential pairs 306, 328. The second differential amplifier 328 is thus controlled independently of the first differential amplifier 306, though with similar bias swings. A second current sink 338 is coupled to the emitters of the second differential amplifier 328 for sinking current, I, through the conductive path.

A second resistive load 340 is coupled to the supply, Vcc, and to a collector 342 of the third transistor 330. In accordance with the present invention, the second resistive load 340 is preferably selected to provide a substantially equivalent amplification factor, in this case (2R), through the third transistor as that of the first differential pair 306.

In accordance with the preferred embodiment of the invention, the similar amplification factor (2R) of the first and second differential pairs 306, 328 is greater than, and preferably at least double, that of the level shifting factor (R) of the first differential pair. A collector 344 of the fourth transistor 332 is coupled to the supply voltage, Vcc. A second output port 346 is coupled to the collector 342 of the third transistor 330 to generate an amplified output signal, OUT. Output signal, OUT, provides an amplified output signal to the comparator 304. Thus, while the amplification factors of the first and second differential pairs 306, 328 are similar, the first differential pair 306 is level shifted. Both the amplified signal, OUT, and the amplified level shifted output signal, OUTx, are provided to the comparator 304 to complete the logic gate 300. In accordance with the present invention, the output signals OUT, OUTx of exclusionary circuit 302 provide differential outputs which meet or exceed the minimum required voltage differential to switch the inputs of further ECL circuits.

In accordance with the present invention, the amplified level shifted output signal, OUTx and the amplified output signal, OUT, provide exclusionary differential signals, which, when compared under all complementary input signal combinations of A, Ax, B, Bx, provide an exclusionary function. Thus, exclusionary circuit 302 of the present invention takes two differential input signals having a small voltage swing and translates them into differential output voltages, OUT, OUTx, which when compared to each other can be fit to a logical AND function or a logical OR function.

The following example is used to describe the operation of the ECL gate 300:

Given complementary input signals of 1.8 volts 1.7 volts, there are provided four combinations of input signals to the circuit 300:

|     | A   | Ax  | B   | Bx  |
| --- | --- | --- | --- | --- |
| (1) | 1.8 | 1.7 | 1.8 | 1.7 |
| (2) | 1.7 | 1.8 | 1.8 | 1.7 |
| (3) | 1.8 | 1.7 | 1.7 | 1.8 |
| (4) | 1.7 | 1.8 | 1.7 | 1.8 |

Under the first combination of input conditions, the voltages applied to the first differential amplifier 306 cause the first transistor 308 to turn on and the second transistor 310 to turn off. The 1.8 volt signal is amplified and level shifted to provide an amplified level shifted output, OUTx, of Vcc-IR.

The first combination of input conditions also cause the third transistor 330 to turn on and the fourth transistor 332 to turn off. An amplified output, OUT, of Vcc-2IR is thus generated for the second differential amplifier 328.

Under the second combination of input conditions, first transistor 308 turns off while second transistor 310 turns on. An amplified level shifted output, OUTx, of Vcc-3IR is generated. The amplified output, OUT, of the second differential amplifier 328 remains Vcc-2IR.

Under the third combination of input conditions, the first differential amplifier 306 generates a level shifted output of Vcc-IR. The third transistor 330, of second differential amplifier 328, turns off and the fourth transistor 332 turns on. The amplified output, OUT, thus floats to supply, Vcc.

Under the fourth combination of input conditions, the first differential amplifier 306 generates a level shifted output of Vcc-3IR and the amplified output, OUT, floats to supply, Vcc.

| A   | Ax  | B   | Bx  | OUTx    | OUT     |
| --- | --- | --- | --- | ------- | ------- |
| 1.8 | 1.7 | 1.8 | 1.7 | Vcc-IR  | Vcc-2IR |
| 1.7 | 1.8 | 1.8 | 1.7 | Vcc-3IR | Vcc-2IR |
| 1.8 | 1.7 | 1.7 | 1.8 | Vcc-IR  | Vcc     |
| 1.7 | 1.8 | 1.7 | 1.8 | Vcc-3IR | Vcc     |

By comparing the amplified level shifted outputs, OUTx, to the amplified outputs, OUT, it can be determined that for all complementary input signal combinations except one (combination 1) that amplified output, OUT, is larger than the amplified level shifted output, OUTx. These outputs, OUT, OUTX, provided by exclusionary circuit 302 meet the minimum required voltage differential to switch the inputs of further ECL circuits. Therefore, the amplified level shifted output of the first differential pair and the amplified output of the second differential pair provide exclusionary differential signals under all combinations of the first and second differential inputs.

If the comparator 304 sets a threshold that OUTx being greater than OUT generates a logic level high then the outputs of comparator 304 for the first (1) through fourth (4) input combinations described above are (1, 0, 0, 0) respectively. Since the complementary input signals A, Ax, B, Bx operate as binary signals, the ECL gate 300, under these conditions, provides an AND gate.

If, on the other hand, the comparator 304 sets a threshold that OUTx being less than output OUT provides a logic level high and complementary inputs are viewed as inverted, then the outputs of comparator 304 are (0, 1, 1, 1) for the first (1) through the fourth (4) input combinations. Therefore, ECL gate 300 can also provide an OR gate.

The first and second differential pairs described by the invention thus generate differential outputs, which, when compared, provide an exclusionary function such as an OR gate or an AND gate. An exclusionary logic gate can therefore be provided by amplifying and level shifting a differential input signal to provide an amplified level shifted output signal while independently amplifying a second differential input signal to provide an amplified output signal. Comparing the amplified level shifted output signal to the amplified output signal results in the exclusionary logic gate.

Accordingly, there has been described a fully differential ECL circuit 300 which generates differential outputs which can be used to provide an OR gate or an AND gate configuration. The ECL gate 300 described by the invention minimizes the use of stacked transistors while utilizing complementary inputs and providing differential outputs. The differential output signals of exclusionary circuit 302 provide the minimum required voltage differential to switch the inputs of further ECL circuits. The fully differential ECL gate of the present invention provides for improved noise immunity in a low voltage environment. The benefits of using the ECL gate described by the invention include being able to use small differential bias signals without the need for a separate reference voltage.

Thus, the ECL gate 300 described by the invention has the advantage of being a fully differential, low voltage circuit which can be biased with small voltage swings. The ECL gate described by the invention is well suited for low voltage bipolar integrated platforms, especially those where space constraints are critical.

Numerous modifications, changes, variations, substitutions, and equivalents will occur to those skilled in the art without departing from the spirit and scope of the present invention as defined by the appended claims.

What is claimed is:

1. An emitter coupled logic (ECL) circuit, comprising:

a first differential pair having an amplification factor and a level shifting factor associated therewith, the first differential pair providing an amplified level shifted output in response to a first differential input;

a second differential pair having an amplification factor substantially equivalent to that of the first differential pair, the second differential pair providing an amplified output in response to a second differential input, the level shifting factor of the first differential pair being less than the substantially equivalent amplification factors of the first and second differential pairs; and the amplified level shifted output of the first differential pair and the amplified output of the second differential pair providing exclusionary differential signals under all combinations of the first and second differential inputs having substantially equivalent voltage swings.

2. An exclusionary logic gate, comprising:

first and second differential amplifiers, each receiving first and second differential inputs respectively, the first and second differential inputs providing substantially equivalent voltage swings;

the first differential amplifier amplifying and level shifting the first differential input and providing an amplified level shifted output;

the second differential amplifier amplifying the second differential input independently of the first differential amplifier and providing an amplified output; and a comparator for comparing the amplified level shifted output to the amplified output.

3. An exclusionary logic gate, as described in claim 2, wherein the exclusionary logic gate functions as an AND gate.

4. An exclusionary logic gate as described in claim 2, wherein the exclusionary logic gate functions as an OR gate.

5. An ECL logic circuit, comprising:

a first differential amplifier generating an amplified level shifted output in response to a first differential input;

a second differential amplifier generating an amplified output independently of the first differential amplifier in response to a second differential input, the first and second differential inputs providing four combinations of differential input signals having substantially equivalent voltage swings; and a comparator for comparing the first and second differential outputs under the four combinations of differential input signals.

6. An ECL logic circuit as described in claim 5, wherein the ECL logic circuit functions as an AND gate.

7. An ECL logic circuit as described in claim 5, wherein the ECL logic circuit functions as an OR gate.

8. A method of providing an exclusionary logic gate, comprising the steps of:

amplifying and level shifting a differential input signal to provide an amplified level shifted output signal;

amplifying a second differential input signal independently of the first differential input signal to provide an amplified output signal, the first and second differential input signals having substantially equivalent voltage swings; and comparing the amplified level shifted output signal to the amplified output signal.

9. The method of claim 8, wherein the exclusionary logic gate functions as an AND gate.

10. The method of claim 8, wherein the exclusionary logic gate functions as an OR gate.

11. A emitter coupled logic (ECL) gate, comprising:

a first differential amplifier formed of first and second emitter coupled transistors receiving a first differential input signal through their respective bases;

a first current sink coupled to the emitters of the emitter coupled transistors;

a first resistive load coupled to a collector of the second transistor and providing an amplification factor for the first differential amplifier;

a level shifting resistor coupled to a supply source and coupled to the first resistive load and a collector of the first transistor;

a first output port coupled to the collector of the second transistor;

a second differential amplifier formed of third and fourth emitter coupled transistors receiving a second differential input signal through their respective bases, the fourth transistor having a collector coupled to the supply source;

a second current sink coupled to the emitters of the emitter coupled transistors of the second differential amplifier;

a second resistive load coupled to the supply source and a collector of the third transistor for providing a substantially equivalent amplification factor to the second differential amplifier as that of the first differential amplifier, the substantially equivalent amplification factor being greater than the level shifting factor;

a second output port coupled to the collector of the third transistor; and the first and second output ports providing first and second output voltages which, when compared under all combinations of the first and second differential input signals having substantially equivalent voltage swings, provide an exclusionary function.

12. An ECL gate as described in claim 11, wherein the exclusionary function functions as an OR gate.

13. An ECL gate as described in claim 11, wherein the exclusionary function functions as an AND gate.

* * * * *